(12) United States Patent
Yokoi et al.

(10) Patent No.: US 12,246,527 B2
(45) Date of Patent: Mar. 11, 2025

(54) MOUNTING SYSTEM

(71) Applicant: FUJI CORPORATION, Chiryu (JP)

(72) Inventors: Yoshimune Yokoi, Kiyosu (JP); Takeshi Kondo, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 18/555,900

(22) PCT Filed: Apr. 23, 2021

(86) PCT No.: PCT/JP2021/016431
§ 371 (c)(1),
(2) Date: Oct. 18, 2023

(87) PCT Pub. No.: WO2022/224432
PCT Pub. Date: Oct. 27, 2022

(65) Prior Publication Data
US 2024/0198653 A1 Jun. 20, 2024

(51) Int. Cl.
*B41F 15/26* (2006.01)
*B41F 15/08* (2006.01)
(Continued)

(52) U.S. Cl.
CPC .......... *B41F 15/12* (2013.01); *B41F 15/0881* (2013.01); *B41F 15/26* (2013.01);
(Continued)

(58) Field of Classification Search
CPC .......... B41F 15/12; B41F 15/26; B41F 15/36; B41F 15/0881; B41F 27/00; B41F 33/16;
(Continued)

(56) References Cited

U.S. PATENT DOCUMENTS 11,765,876 B2 *  9/2023  Kondo ................. H05K 13/086
                                                                29/739
2018/0065357 A1    3/2018  Mantani et al.
(Continued)

FOREIGN PATENT DOCUMENTS

CN   117546621 A  *  2/2024  .......... H05K 13/021
CN   118265611 A  *  6/2024
(Continued)

OTHER PUBLICATIONS

International Search Report issued Jul. 6, 2021 in PCT/JP2021/016431, filed on Apr. 23, 2021, 2 pages.

*Primary Examiner* — Christopher E Mahoney
*Assistant Examiner* — Marissa Ferguson-Samreth
(74) *Attorney, Agent, or Firm* — Oblon, McClelland, Maier & Neustadt, L.L.P.

(57) ABSTRACT

A mounting system including a printing device that prints a viscous fluid on a processing target object using a screen mask, an exchange unit disposed in the printing device and configured to automatically exchange a printing related member for use in the printing device between the printing device and the exchange unit, one or more mounting devices including a mounting section configured to mount a component on the processing target object, and a moving work device configured to move around a circumference of the mounting device to automatically attach and detach a mounting related member for use in the mounting device between the mounting device and the moving work device. The printing device and the mounting device are disposed in such a manner that front surfaces thereof lie on the same side, and the exchange unit and the moving work device are disposed on the same side.

6 Claims, 8 Drawing Sheets

(51) Int. Cl.
*B41F 15/12* (2006.01)
*B41F 15/36* (2006.01)

(52) U.S. Cl.
CPC .......... *B41F 15/36* (2013.01); *B41P 2215/10* (2013.01); *B41P 2215/50* (2013.01)

(58) Field of Classification Search
CPC .......... H05K 3/12; H05K 3/34; H05K 3/1216; H05K 3/3485; H05K 13/00; B41P 2215/10; B41P 2215/50
See application file for complete search history.

(56) References Cited

U.S. PATENT DOCUMENTS

| | | | |
|---|---|---|---|
| 2019/0291410 A1* | 9/2019 | Yokoi | B41F 15/08 |
| 2019/0337290 A1* | 11/2019 | Hirukawa | B41F 15/44 |
| 2020/0103872 A1 | 4/2020 | Kuroda et al. | |
| 2020/0396843 A1* | 12/2020 | Losiewicz | B41M 1/12 |
| 2021/0197545 A1 | 7/2021 | Yokoi | |
| 2022/0087087 A1 | 3/2022 | Minoshima et al. | |

FOREIGN PATENT DOCUMENTS

| | | |
|---|---|---|
| EP | 2 874 481 A1 | 5/2015 |
| EP | 3 344 027 A1 | 7/2018 |
| JP | 2018-39173 A | 3/2018 |
| WO | WO 2018/142547 A1 | 8/2018 |
| WO | WO 2019/016924 A1 | 1/2019 |
| WO | WO 2019/225002 A1 | 11/2019 |
| WO | WO 2020/161830 A1 | 8/2020 |

\* cited by examiner

MOUNTING SYSTEM

TECHNICAL FIELD

The present description discloses a mounting system.

BACKGROUND ART

In printing devices for executing a printing process of printing a viscous fluid on a printing target such as a board using a screen mask, there has conventionally been proposed a printing device in which a screen mask for a subsequent use is caused to wait at the rear of a printing position (for example, refer to Patent Literature 1). In addition, as printing devices, there has been proposed a printing device in which a mask exchange unit is provided at a front surface of the printing device (for example, refer to Patent Literature 2). Further, in mounting systems including a printing device and a mounting device, there has been proposed a mounting system in which a moving work device for exchanging members for use in a mounting device is provided at a front surface of the mounting device (for example, refer to Patent Literature 3).

PATENT LITERATURE

Patent Literature 1: JP-A-2018-39173
Patent Literature 2: WO2018/142547
Patent Literature 3: WO2019/016924

BRIEF SUMMARY

Technical Problem

With the printing devices described above, however, in the case that a screen mask is caused to wait at the rear, for the printing device, a member for exchange is supplied from the rear of the printing device, while for the mounting device, a member for exchange is supplied from the front of the mounting device, whereby both the space efficiency and the work efficiency are not good. In this way, with such mounting systems, there has been the problem in that both the work efficiency and the space efficiency need to be enhanced more in exchanging members.

The present disclosure has been made in view of the problem described above, and a main object thereof is to provide a mounting system which can enhance both the work efficiency and the space efficiency more in exchanging members for use in the mounting system.

Solution to Problem

A mounting system disclosed by the present description adopts the following means to achieve the main object described above.

According to the present disclosure, there is provided a mounting system including:
 a printing device including a printing section configured to execute a printing process of printing a viscous fluid on a processing target object using a screen mask;
 an exchange unit disposed in the printing device and configured to automatically exchange a printing related member for use in the printing device between the printing device and the exchange unit;
 one or more mounting devices including a mounting section configured to mount a component on the processing target object; and
 a moving work device configured to move around a circumference of the mounting device to automatically attach and detach a mounting related member for use in the mounting device between the mounting device and the moving work device,
 wherein the printing device and the mounting device are disposed in such a manner that front surfaces thereof lie on the same side, and the exchange unit and the moving work device are disposed on the same side.

With this mounting system, since the exchange unit of the printing device and the moving work device of the mounting device are disposed on the same side, the work efficiency in exchanging members and the space efficiency of work space can be enhanced more.

DESCRIPTION OF EMBODIMENTS

Figure 1:
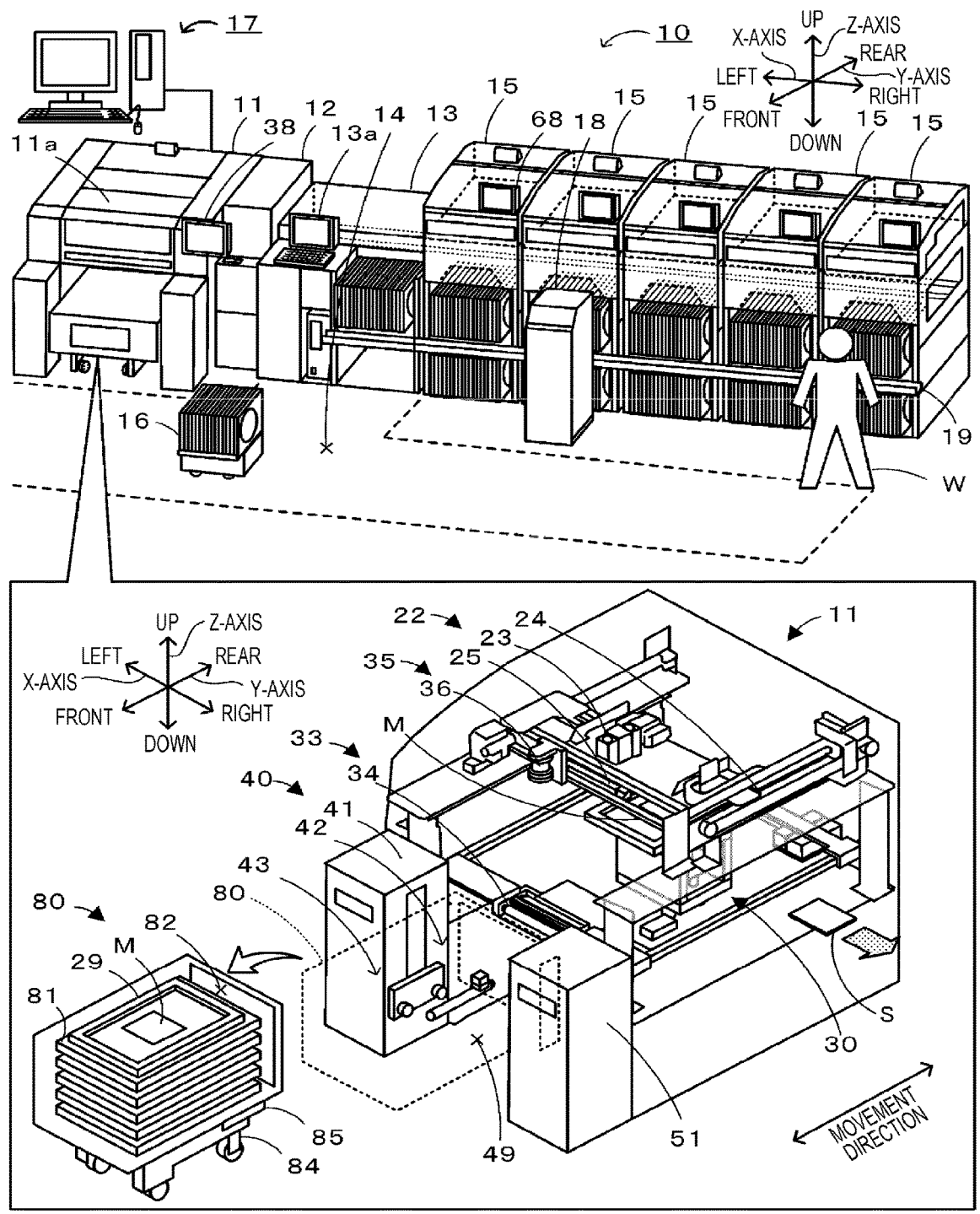
FIG. 1 is a schematic explanatory view showing an example of mounting system 10 and printing device 11.
Figure 2:
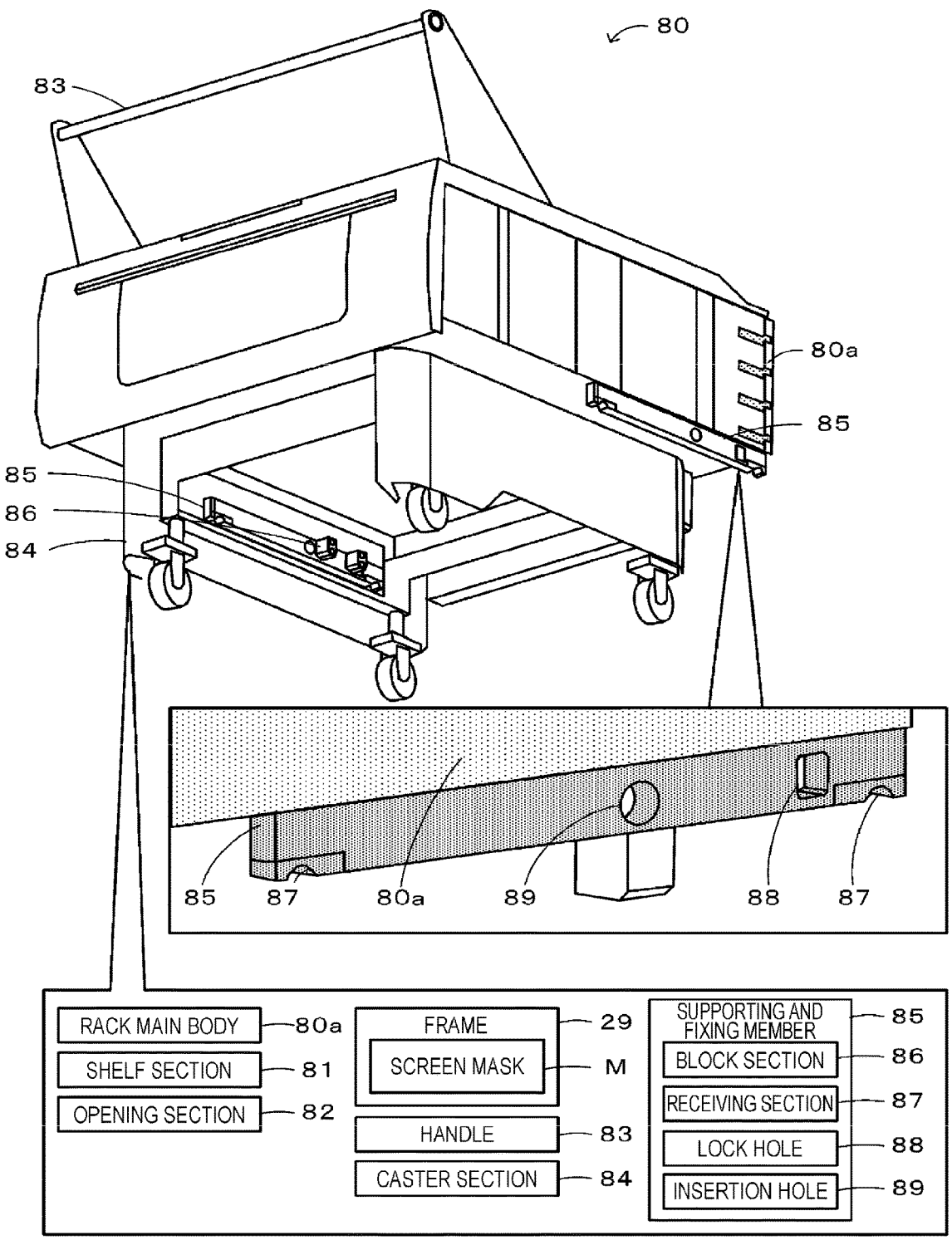
FIG. 2 is a schematic explanatory view of accommodation rack 80.
Figure 3:
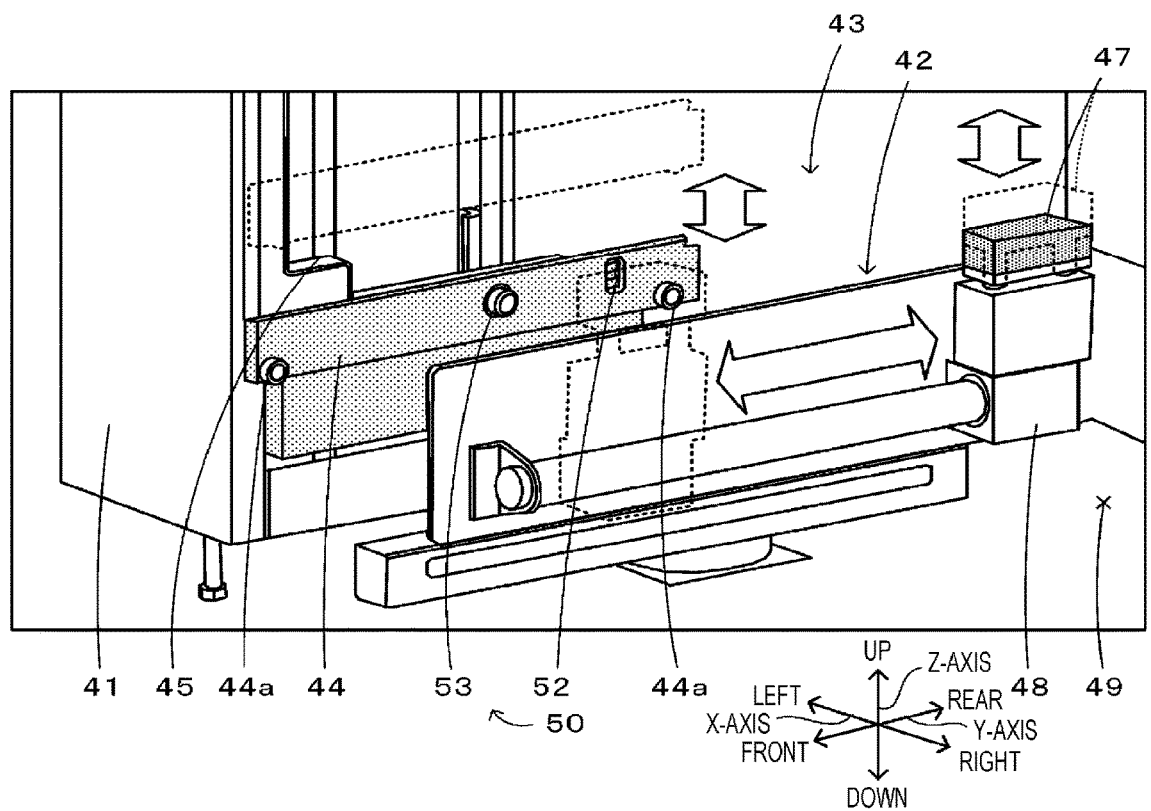
FIG. 3 is an explanatory view showing an example of rack moving section 43.
Figure 4:
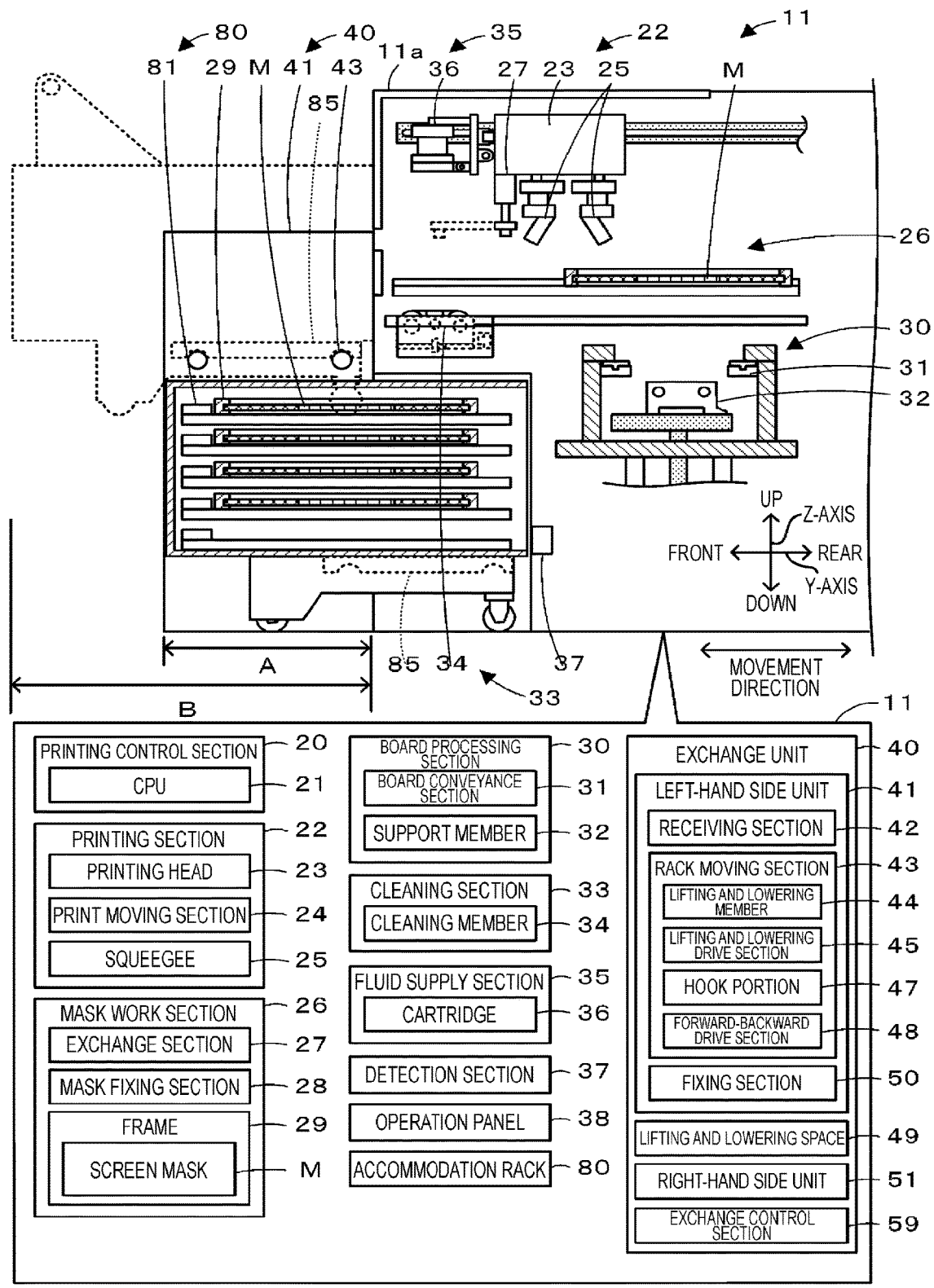
FIG. 4 is an explanatory view showing an example of printing device 11, exchange unit 40, and accommodation rack 80.
Figure 5:
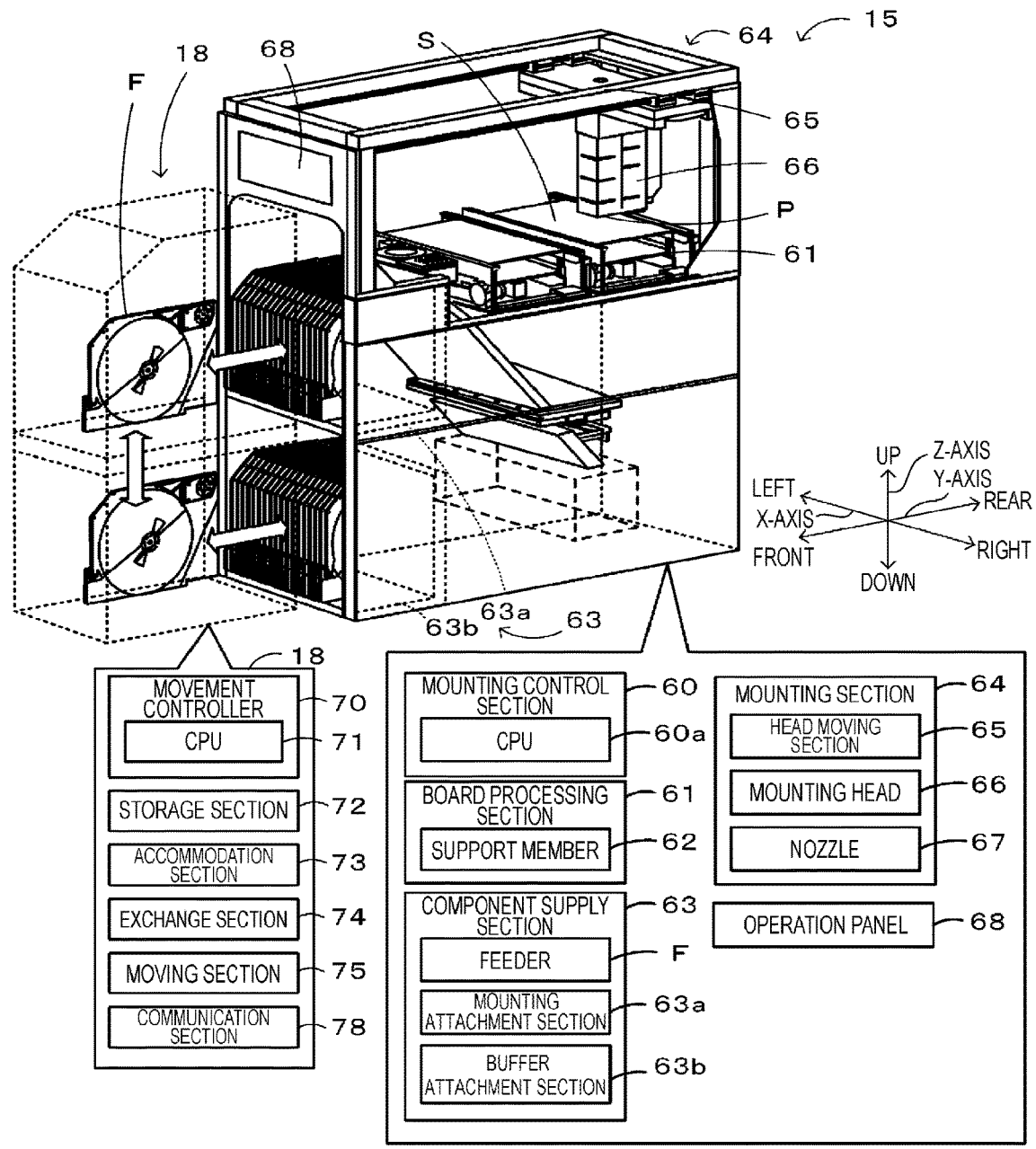
FIG. 5 is an explanatory view showing an example of mounting device 15 and loader 18.
Figure 6:
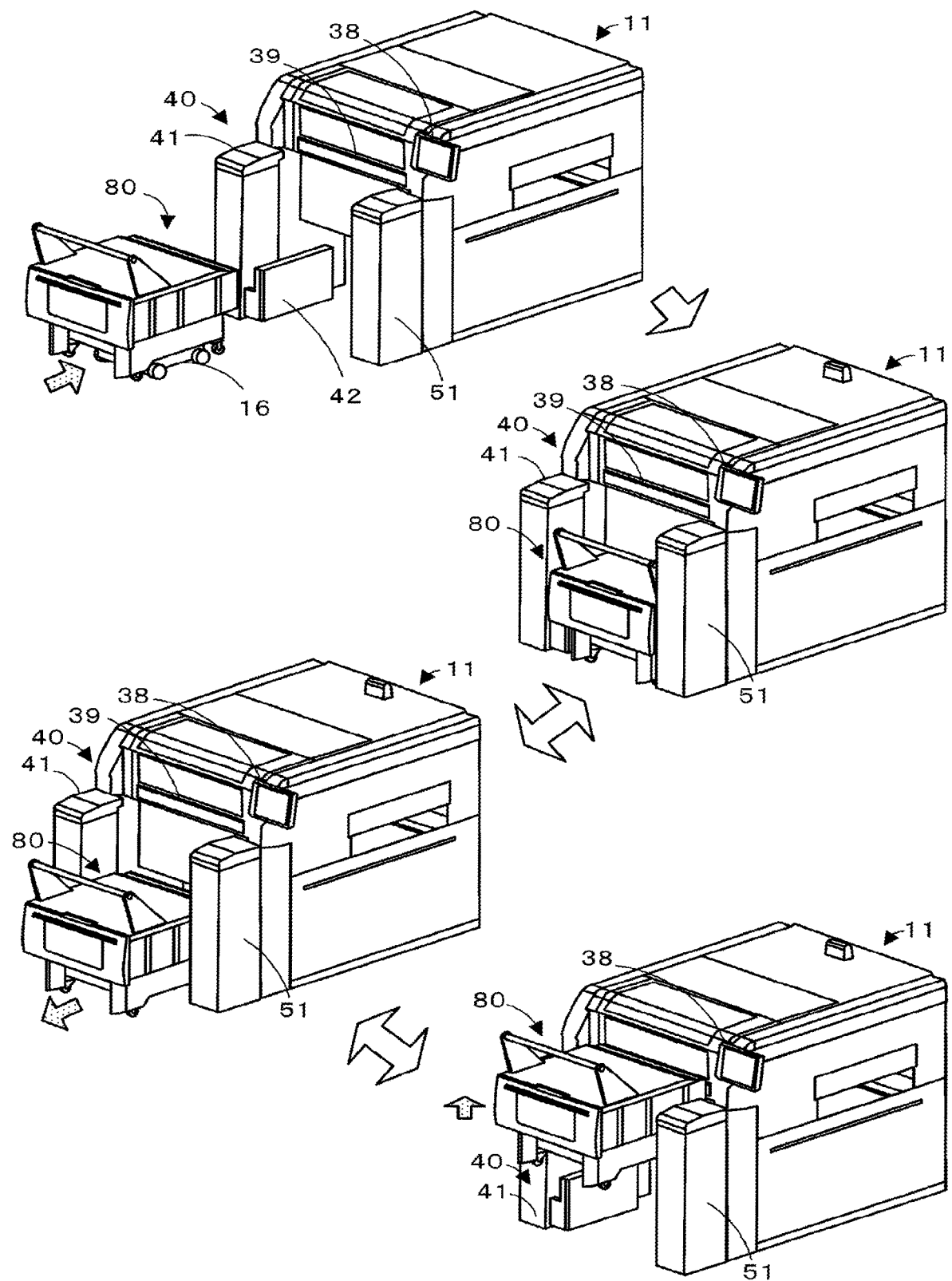
FIG. 6 is an explanatory view showing that accommodation rack 80 is received and moved between an accommodation position and an exchange position.
Figure 7A:
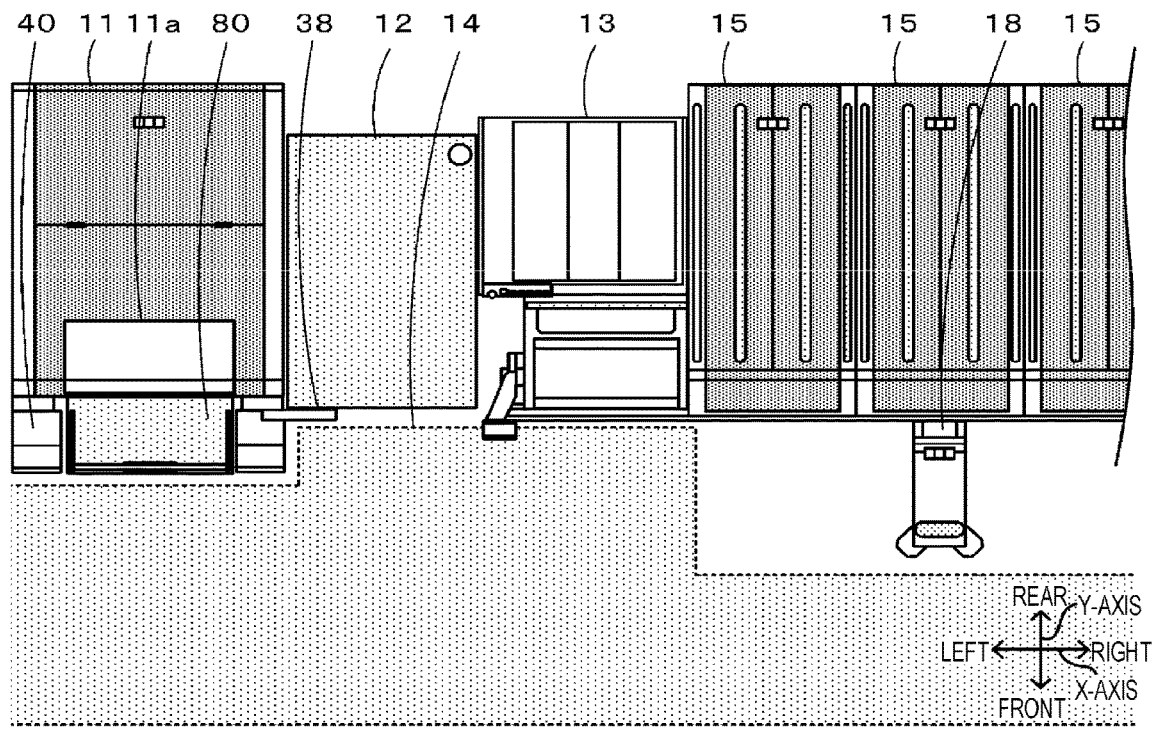
FIG. 7 is a plan view of mounting system 10.
Figure 7B:
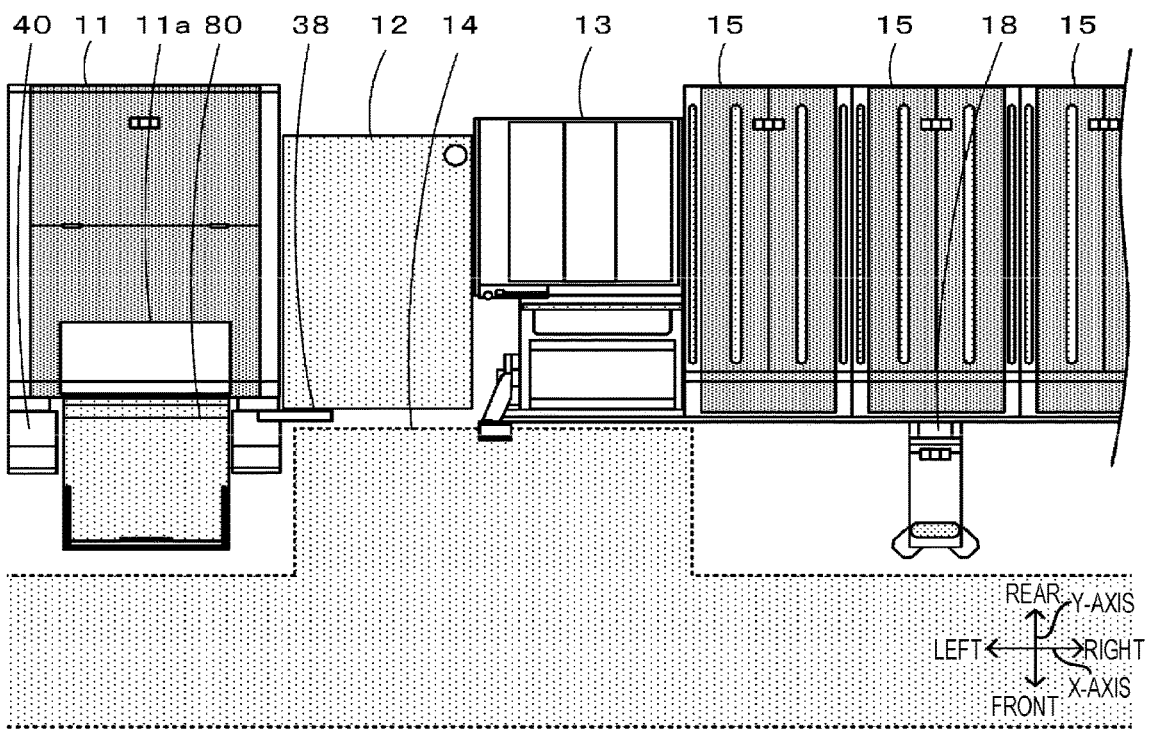

Hereinafter, an embodiment of the present disclosure will be described with reference to accompanying drawings. FIG. 1 is a schematic explanatory view showing an example of mounting system 10 and printing device 11 according to the present disclosure. FIG. 2 is a schematic explanatory view of accommodation rack 80. FIG. 3 is an explanatory view showing an example of rack moving section 43. FIG. 4 is an explanatory view showing an example of printing device 11, exchange unit 40, and accommodation rack 80. FIG. 5 is an explanatory view showing an example of mounting device 15 and loader 18. FIG. 6 is an explanatory view showing that accommodation rack 80 is received by receiving section 42 and moved between an accommodation position and an exchange position. FIG. 7 is a plan view of mounting system 10, in which FIG. 7A is a drawing showing that accommodation rack 80 is situated in an accommodation position, and FIG. 7B is a drawing showing that accommodation rack 80 is situated in an exchange position. This mounting system 10 includes printing device 11, print inspection device 12, storage device 13, mounting device 15, automatic conveyance vehicle 16, management computer (PC) 17, loader 18, mounting inspection device, not shown, and a reflow device, not shown. Mounting system 10 is configured as, for example, a production line in which mounting devices 15 for executing a mounting process of mounting component P on board S as a processing target object are arranged in a conveyance direction of board S on a downstream side of printing device 11. In the present embodiment, a left-right direction (an X-axis), a front-rear direction (a Y-axis), and an up-down direction (a Z-axis) are as shown in FIGS. 1, 3 to 6.

Print inspection device 12 is a device for inspecting the state of a viscous fluid such as a solder paste which is printed on board S by printing device 11. The mounting inspection device is a device for inspecting the state or the like of component P mounted on board S. The reflow device is a device for reflowing a board on which solder is printed and component P is mounted. Management PC 17 is a device for managing information on the individual constituent devices of mounting system 10. This management PC 17 manages a progress status of the constituent devices of the production line which are involved in a mounting process.

As shown in FIGS. 1 to 4, printing device 11 is a device for applying (printing) solder as a viscous fluid to board S as a processing target object lying below through a pattern hole formed in screen mask M by pushing solder on screen mask M into the pattern hole using squeegee 25. Here, as the "processing target object", for example, board S on which component P is mounted, a base material which is a three-dimensional object, or the like is raised. Solder paste or conductive paste, an adhesive, or the like is raised as the "viscous fluid". Here, board S and solder paste are used as examples for the following description. Screen mask M is fixed to an inside of frame 29. Frame 29 is such that screen masks M of various sizes can be fixed thereto and is sized so as to be accommodated in shelf section 81 of accommodation rack 80 (refer to FIG. 1). As shown in FIG. 4, printing device 11 includes printing control section 20, printing section 22, mask work section 26, board processing section 30, cleaning section 33, fluid supply section 35, detection section 37, operation panel 38, and exchange unit 40. In addition, printing device 11 includes operation door 11a provided on a front surface side thereof so as to be opened and closed when operator W accesses an interior portion of the device for maintenance or the like.

Printing control section 20 is configured as a microprocessor mainly including CPU and controls the whole of printing device 11. Printing control section 20 outputs a signal to management PC 17 as an external device in addition to printing section 22, mask work section 26, board processing section 30, cleaning section 33, fluid supply section 35, operation panel 38, and exchange unit 40. In addition, printing control section 20 receives a signal from management PC 17, which is the external device, as an input therefrom in addition to printing section 22, mask work section 26, board processing section 30, cleaning section 33, fluid supply section 35, detection section 37, operation panel 38, and exchange unit 40. This printing control section 20 has a storage section configured to store information on board S onto which a printing process is executed, a printing process program for executing a printing process on board S, a member exchange process program for executing an exchange process of frames 29 by exchange section 27, and the like.

Printing section 22 is disposed at an upper stage of printing device 11 and constitutes a unit for executing a printing process of printing a viscous fluid on board S using screen mask M. As shown in FIGS. 1, 4, printing section 22 includes printing head 23, print moving section 24, a squeegee lifting and lowering section, not shown, and squeegee 25. Print moving section 24 is such as to move printing head 23 in a predetermined printing direction (herein, a front-rear direction), and includes a guide formed in the front-rear direction, a slider configured to move along the guide, and a motor for driving the slider. Squeegee 25 is disposed on a lower surface side of printing head 23 and is lifted and lowered by the squeegee lifting and lowering section. Printing section 22 has two squeegees 25 each of which is used in the front-rear direction. As shown in FIG. 4, mask work section 26 is disposed between printing section 22 and board processing section 30 in an up-down direction and constitutes a unit for fixing and holding screen mask M. Mask work section 26 includes exchange section 27 and mask fixing section 28. Exchange section 27 is a conveyance rod provided on printing head 23, and this exchange section 27 is lowered to a position where exchange section 27 is brought into abutment with screen mask M by an air cylinder, not shown, and is then rotated whereby an abutting section configured to be brought into abutment with frame 29 moves also in the front-rear direction (refer to dashed lines in FIG. 4). Printing head 23 and exchange section 27 are such as to be brought into engagement with frame 29 so as to move that frame 29 between shelf section 81 at a predetermined height in accommodation rack 80 and printing section 22. Mask fixing section 28 positions screen mask M and supports and fixes that screen mask M in a horizontal posture. Screen mask M is pushed to move along the guide of mask work section 26 in the front-rear direction by exchange section 27 and is fixed by mask fixing section 28. Board processing section 30 is disposed below mask work section 26 and constitutes a unit for conveying in board S, positioning and supporting the board S, and bringing board S into contact with screen mask M and away therefrom. Board processing section 30 includes board conveyance section 31 for conveying board S in a left-right direction, support member 32 for supporting board S from below, and a board lifting and lowering section for lifting and lowering the whole of board processing section 30 and support member 32. Cleaning section 33 is disposed between mask work section 26 and board processing section 30 in the up-down direction and constitutes a unit for executing a cleaning process of cleaning a rear surface of screen mask M. Cleaning section 33 has cleaning member 34, whereby screen mask M is cleaned as a result of cleaning member 34 being brought into abutment therewith. Fluid supply section 35 constitutes a unit for supplying solder accommodated in cartridge 36 onto screen mask M. Fluid supply section 35 is disposed ahead of printing head 23. Fluid supply section 35 applies a pressure to cartridge 36 so as to discharge solder from cartridge 36. Cleaning member 34 and cartridge 36 are consumables and are then exchanged as required. Detection section 37 is a sensor for detecting an existence of accommodation rack 80 in a front interior portion of printing device 11. Operation panel 38 is a unit for receiving an input from operator W and presenting information to operator W. This operation panel 38 is disposed on a front surface of printing device 11 and includes a display section constituting a display and a touch-panel type operation section having a button.

Accommodation rack 80 is an accommodation body for accommodating frames 29 configured to support screen mask M as a printing related member for a printing process executed at printing section 22. As shown in FIGS. 1, 2, accommodation rack 80 has rack main body 80a, handle 83, caster sections 84, and supporting and fixing members 85. Rack main body 80a has multiple shelf sections 81 and one opening section 82. Shelf sections 81 are disposed in such a manner as to be aligned at predetermined intervals in the up-down direction so that frames 29 supporting screen mask M can be placed in the up-down direction. Opening section 82 communicates with the outside such as printing section 22, and frame 29 is conveyed in and out through this opening section 82. This accommodation rack 80 only accommodates frames 29 and includes no driving source such as a driving section for moving frame 29 and a driving section for lifting and lowering frame 29. With this accommodation rack 80, the configuration can be simplified more. Shelf section 81 has a size which can deal with frame sizes for various types of printing related members. That is, shelf section 81 is sized so as to accommodate largest frame 29. This accommodation rack 80 may be configured to have shelf sections 81 which individually deal with frame sizes for various types of printing related members, or one accommodation rack 80 may be configured to have multiple shelf sections 81 of the same size. In the latter case, multiple accommodation racks 80 having the same external size may be prepared, so that shelf sections 81 of each accommodation rack 80 correspond to any one of frame sizes for various types of printing related members. In this case, although the number of types of accommodation racks 80 is increased, even though frame sizes of corresponding printing related members differ, since the external sizes of accommodation racks 80 are the same, those accommodation racks 80 can individually share receiving section 42. Handle 83 is fixed to an upper portion of rack main body 80*a*. Handle 83 includes a rod-shaped body configured to be gripped by operator W and a support member which fixes the rod-shaped body. Caster section 84 is disposed at a lower portion of rack main body 80*a*. This caster section 84 includes a structure having a space in the center thereof and a caster having a wheel disposed on a lower surface side of the structure. Operator W can move accommodation rack 80 by holding this handle 83. Here, as printing related members, there are raised, for example, squeegee 25, support member 32, cleaning member 34, cartridge 36, and the like in addition to screen mask M.

Supporting and fixing member 85 is a plate-shaped member and is fixed to left and right end portions at a front of a lower surface of rack main body 80*a*. This supporting and fixing member 85 is a member which is used for connection to exchange unit 40. As shown in FIG. 2, supporting and fixing member 85 has block section 86, receiving sections 87, lock hole 88, and insertion hole 89. Block section 86 is a member to which hook portion 47 of exchange unit 40 is connected and has a space, defined between two blocks, into which hook portion 47 is inserted. Receiving section 87 is a section for receipt of cam follower 44*a* disposed on lifting and lowering member 44 of exchange unit 40 and has an arc-shaped notch. Lock hole 88 is a through hole into which clamp lever 52 of fixing section 50 disposed on lifting and lowering member 44 of exchange unit 40 is inserted. Insertion hole 89 is a through hole into which insertion pin 53 of fixing section 50 disposed in lifting and lowering member 44 of exchange unit 40 is inserted.

Exchange unit 40 is a unit configured to be used in printing device 11 including printing section 22 for executing a printing process of printing a viscous fluid on a processing target object using screen mask M so as to automatically exchange printing related members for use in printing device 11 between printing device 11 and exchange unit 40. Exchange unit 40 is configured as a device for receiving accommodation rack 80 which accommodates printing related members such as screen masks M which are fixed to frames 29 to lift up and lower accommodation rack 80. Exchange unit 40 has left-hand side unit 41 and right-hand side unit 51. Left-hand side unit 41 is disposed at a front left-hand side of a housing of printing device 11. Right-hand side unit 51 is disposed at a front right-hand side of the housing of printing device 11. As shown in FIG. 4, these left-hand side unit 41 and right-hand side unit 51 are formed such that length A along a movement direction of frame 29 is shorter than length B of accommodation rack 80. This exchange unit 40 has lifting and lowering space 49 where to lift and lower accommodation rack 80 in a center between left-hand side unit 41 and right-hand side unit 51. When accommodation rack 80 is situated in an accommodation position, this exchange unit 40 accommodates accommodation rack 80 in the same surface as a main body front surface of exchange unit 40 or more inwards of the main body front surface, whereas when accommodation rack 80 is situated in an exchange position, this exchange unit 40 supports accommodation rack 80 in a position projecting from the main body front surface of the exchange unit 40. Here, right-hand side unit 51 has the same configuration as that of left-hand side unit 41 excluding the fact that right-hand side unit 51 faces left-hand side unit 41, and hence, a detailed description of right-hand side unit 51 will be omitted. Here, right-hand side unit 51 includes a receiving section, a rack moving section, a lifting and lowering member, cam followers, a lifting and lowering drive section, a forward-backward moving section, a hook portion, a forward-backward drive section, a fixing section, and the like.

Left-hand side unit 41 includes receiving section 42, rack moving section 43, and fixing section 50. Receiving section 42 receives accommodation rack 80 having multiple shelf sections 81 where to accommodate frame 29 for supporting a printing related member for use in printing device 11 and supports this accommodation rack 80 from a lower surface side thereof so as to lift up and lower the accommodation rack 80. Rack moving section 43 lifts and lowers, and moves forwards and backwards accommodation rack 80 among an exchange position where to exchange printing related members, a liftable position which lies below this exchange position, and an accommodation position where to enable accommodation rack 80 to enter an interior portion of the housing of printing device 11. As shown in FIG. 3, rack moving section 43 includes lifting and lowering member 44, lifting and lowering drive section 45, hook portion 47, and forward-backward drive section 48. Lifting and lowering member 44 is a plate-shaped member which is provided on a surface of left-hand side unit 41 which faces right-hand side unit 51. This lifting and lowering member 44 is caused to move up and down along an internal surface of the housing of left-hand side unit 41 by lifting and lowering drive section 45. Cam followers 44*a* are disposed individually at front and rear end portions of lifting and lowering member 44. Cam followers 44*a* support supporting and fixing member 85 disposed on accommodation rack 80 from below and move accommodation rack 80 up and down as lifting and lowering member 44 moves up and down. Lifting and lowering drive section 45 may have a ball screw having a lifting and lowering shaft and a drive motor so as to move lifting and lowering member 44 up and down or may be configured to move lifting and lowering member 44 up and down using a linear motor. In addition, rack moving section 43 has fixing section 50 configured to, when accommodation rack 80 moves to the liftable position to enter a state in which accommodation rack 80 can be lifted up and lowered, restrict accommodation rack 80 from moving in a horizontal direction and/or from falling. When accommodation rack 80 is lifted up or lowered by rack moving section 43, fixing section 50 functions as a safety mechanism for preventing accommodation rack 80 from moving or falling unintentionally. Fixing section 50 includes a clamp section having clamp lever 52 configured to be inserted in lock hole 88 formed in supporting and fixing member 85, a stopper section having insertion pin 53 configured to be inserted in insertion hole 89 formed in supporting and fixing member 85, and the like. Hook portion 47 is a member disposed on a shaft of forward-backward drive section 48 in such a manner as to be lifted and lowered and configured to be lifted towards block section 86 provided on accommodation rack 80 so as to be brought into engagement with this block section 86. Forward-backward drive section 48 moves hook portion 47 between an accommodation position and a liftable position. Forward-backward drive section 48 may have a ball screw and a drive motor so as to move hook portion 47 forwards and backwards or may be configured to move hook portion 47 forwards and backwards using a linear motor.

Exchange unit 40 has exchange control section 59. Exchange control section 59 is configured as a microprocessor which mainly includes CPU and controls the whole of exchange unit 40. Exchange control section 59 outputs a signal to printing control section 20 in addition to lifting and lowering drive section 45 and forward-backward drive section 48. In addition, exchange control section 59 receives a signal from printing control section 20 as an input therefrom. When acquiring a signal indicating that accommodation rack 80 is received by receiving section 42, this exchange control section 59 executes a process of lifting up hook portion 47 so as to bring this hook portion 47 into engagement with block section 86. In addition, when exchanging printing related members, exchange control section 59 executes a process of causing rack moving section 43 to lift up accommodation rack 80 from the accommodation position to the exchange position by way of the liftable position. In addition, when the exchange of printing related member is completed, exchange control section 59 causes rack moving section 43 to move accommodation rack 80 from the exchange position to the accommodation position by way of the liftable position.

Mounting device 15 is a device for picking up component P and mounting the component P onto board S as a processing target object. As shown in FIG. 5, this mounting device 15 includes mounting control section 60, board processing section 61, component supply section 63, and mounting section 64. In addition, mounting device 15 includes an operation door provided in a front surface thereof so as to be opened and closed when operator W accesses an interior portion of the device for maintenance or the like. Board processing section 61 performs not only a process of loading, conveying, fixing in a mounting position, and unloading board S, but also a process of supporting board S from below using support member 62. Support member 62 includes a backup plate, which is a support, a backup pin which is disposed in a desired position in accordance with board S, and the like. This backup pin may be configured to be disposed in a predetermined position on the backup plate by mounting section 64. Mounting control section 60 is configured as a microprocessor which mainly includes CPU 60a and governs the control of the whole of the device. Mounting control section 60 has storage section for storing mounting condition information (a production job) which includes information on component P, and information on a disposition order and a disposition position in which component P is mounted on board S, a mounting position of feeder F where component P is picked up, and the like. Mounting control section 60 outputs control signals to board processing section 61, component supply section 63, mounting section 64, and operation panel 68 and receives signals from board processing section 61, component supply section 63, mounting section 64, and operation panel 68 as inputs therefrom. Component supply section 63 is a unit for supplying component P to mounting section 64. In this component supply section 63, feeders F including a reel around which a tape is wound which is a holding member for holding components P are attached to one or more attachment sections. This component supply section 63 includes mounting attachment section 63a to which feeders F for use for a mounting process are attached and buffer attachment section 63b to which spare feeders F are attached, in upper and lower stages. Here, mounting attachment section 63a and buffer attachment section 63b are referred to generally as an attachment section. Feeder F includes a controller, not shown. This controller stores information on ID of a tape contained in feeder F, a type of component P, the remaining number thereof, and the like. When feeder F is attached to the attachment section, a controller provided therein transmits information on the feeder F to mounting control section 60. In addition, component supply section 63 may include a tray unit having a tray as a holding member on which multiple arrays of components P are placed.

Mounting section 64 is a unit for picking up component P from component supply section 63 and disposing the component P onto board S which is fixed in place by board processing section 61. Mounting section 64 includes head moving section 65, mounting head 66, and nozzle 67. Head moving section 65 includes a slider configured to move in XY-directions while being guided by a guide rail, and a motor for driving the slider. Mounting head 66 is configured to pick up one or more components P and is caused to move in the XY-directions by head moving section 65. This mounting head 66 is mounted detachably on the slider. One or more nozzles 67 are detachably mounted on a lower surface of mounting head 66. Nozzle 67 is such as to pick up component P by making use of a negative pressure. Here, a pickup member for picking up component P may be a mechanical chuck for mechanically holding component P or the like in addition to nozzle 67. Operation panel 68 is a unit for receiving an input from operator W and presenting information to operator W. This operation panel 68 is disposed on a front surface of mounting device 15, and includes a display section as a display and a touch panel-type operation section having buttons.

As shown in FIG. 1, storage device 13 is a storing place for temporarily storing feeders F as mounting related members for use in mounting device 15. Storage device 13 includes a conveyance device for conveying board S and host PC 13a for managing information, and is provided between print inspection device 12 and mounting device 15. Storage device 13 has a similar attachment section to that of component supply section 63. When feeder F is connected to this attachment section, the controller of feeder F outputs information on the feeder F to host PC 13a connected to storage device 13. Here, in storage device 13, feeder F may be carried by automatic conveyance vehicle 16, or feeder F may be carried by operator W. Automatic conveyance vehicle 16 conveys a member for use in mounting system 10, for example, a printing related member for use in exchange unit 40 or a mounting related member for use in loader 18. This automatic conveyance vehicle 16 automatically conveys, for example, printing related members, mounting related members, or the like between a warehouse, not shown, and storage device 13. This automatic conveyance vehicle 16 may be configured as AGV (Automatic Guided Vehicle) which moves on a predetermined traveling path, or may be configured as AMR (Autonomous Mobile Robot) that moves to a destination on a free route by detecting surroundings thereof. Here, when moving accommodation rack 80, automatic conveyance vehicle 16 may be configured to move accommodation rack 80 by, for example, lifting up a loading section, not shown, disposed on an upper surface thereof in such a state that automatic conveyance vehicle 16 enters a space defined in the center between the caster sections 84 (refer to FIG. 6A, which will be described later).

Loader 18 is configured as a mobile work device, and constitutes a device configured to move within a movement region that exists around mounting device 15 on a front surface side of this mounting device 15 so as to automatically attach and detach mounting related members such as feeders F for use in mounting device 15 to collect and feed them. As shown in FIG. 5, this loader 18 includes movement controller 70, storage section 72, accommodation section 73, exchange section 74, moving section 75, and communication section 78. Movement controller 70 is configured as a microprocessor which mainly includes CPU 71 and governs the whole of the device. This movement controller 70 causes the whole of the device to move feeders F to and from storage device 13 so as to collect feeders F from component supply section 63 or feed feeders F to component supply section 63. Storage section 72 has a storage medium such as HDD for storing various types of data such as a process program, and the like. Accommodation section 73 has an accommodation space for accommodating one or more feeders F. This accommodation section 73 is configured to accommodate, for example, four feeders F. Exchange section 74 is a mechanism for loading and unloading feeders F to and from accommodation section 73 and moving feeders F between the upper stage and the lower stage. This exchange section 74 has a clamp section for clamping feeder F, a Y-axis slider for moving the clamp section in a Y-axis direction (the front-rear direction), and a Z-axis slider for moving the clamp section in a Z-axis direction (the up-down direction). Exchange section 74 attaches and detaches feeders F to and from mounting attachment section 63a, attaches and detaches feeders F to and from buffer attachment section 63b, and attaches and detaches feeders F to and from the attachment section of storage device 13. Moving section 75 is a mechanism for moving loader 18 in the X-axis direction (the left-right direction) along X-axis rail 19 disposed on front surfaces of mounting devices 15. Communication section 78 is an interface for exchanging information with host PC 13a of storage device 13 and external devices such as mounting devices 15. This loader 18 outputs the current position and the work details executed thereby to host PC 13a. This loader 18 can automatically attach and detach feeders F as mounting related members; however, loader 18 may be configured to collect and feed mounting process related members such as support member 62, mounting head 66, nozzle 67, and the like.

In mounting system 10, printing device 11 and mounting devices 15 are disposed such that the front surfaces thereof lie on the same side, and exchange unit 40 and loader 18 as the moving work device are disposed on the same side. In addition, in mounting system 10, operation door 11a of printing device 11, the work door of mounting device 15, operation panel 38 of printing device 11, and operation panel 68 of mounting device 15 are disposed on the same front surface side. In particular, in mounting system 10, exchange unit 40 and loader 18 are disposed on the front surface side of printing device 11 and mounting device 15. In this mounting system 10, storage device 13 is disposed between printing device 11 and mounting device 15 in such a manner that the exchange work position lies on the same side as exchange unit 40 and loader 18. In addition, in this mounting system 10, as shown in FIG. 1, automatic conveyance vehicle 16 has traveling path 14 on the side where exchange unit 40 and loader 18 are disposed. Loader 18 exchanges feeders F as mounting related members between storage device 13 and mounting device 15.

Subsequently, a printing process which is executed by printing device 11 configured in the way described heretofore will be described. When printing device 11 executes a printing process, automatic conveyance vehicle 16 conveys accommodation rack 80 to exchange unit 40 (a first step in FIG. 6) so as to attach the accommodation rack 80 to exchange unit 40 (a second step in FIG. 6). After automatic conveyance vehicle 16 causes exchange unit 40 to receive accommodation rack 80, operator W inputs a command to execute a printing process from operation panel 38. A printing process routine for execution of a printing process is stored in the storage section of printing control section 20 and is executed after printing control section 20 receives the printing process execution command from operator W as an input therefrom. When the printing process routine is started, CPU 21 of printing control section 20 first executes an abutment process of bringing board S into abutment with screen mask M by causing board processing section 30 to convey, fix, and lift up board S. For this process, CPU 21 causes mask work section 26 to adjust the position of screen mask M for position alignment of the pattern hole with board S. Subsequently, CPU 21 causes cartridge 36 to move to lie above screen mask M, causing cartridge 36 to discharge solder therein onto screen mask M. Subsequently, while causing printing head 23 to move, CPU causes squeegees 25 to lower so as to be brought into abutment with an upper surface of screen mask M while causing these squeegees 25 to move in the front-rear direction so as to print the solder on board S. In this way, printing control section 20 executes the printing process including the board conveyance and fixation process, the solder supply process, and the squeegees moving process to thereby print the solder on board S. In addition, when the use of screen mask M is completed, CPU 21 executes an exchange process of exchanging it with screen mask M for a subsequent use. Firstly, CPU 21 pulls out accommodation rack 80 from the interior portion of the housing of printing device 11 (a third step in FIG. 6), and lifts up accommodation rack 80 to the exchange position (a fourth step in FIG. 6). Then, CPU 21 causes exchange section 27 to exchange screen masks M, and when the exchange is completed, CPU 21 causes rack moving section 43 to move accommodation rack 80 to the accommodation position. CPU 21 repeatedly executes the printing process while exchanging screen masks M until the production process of all types of boards S described in the production plan is completed.

Next, a mounting process will be described in which mounting device 15 mounts component P on board S. When a mounting process is started, CPU 60a of mounting control section 60 firstly causes board processing section 61 to load and fix board S. Subsequently, CPU 60a reads out the mounting condition information, and causes mounting head 66 to pick up component P from feeder F attached to component supply section 63 based on the mounting condition information and to dispose the component P onto board S. When the disposition of component P on board S is completed, CPU 60a causes board processing section 61 to discharge board S and repeats the process described above. During the mounting process, CPU 60a manages the number of consumed components in each feeder F, and when the remaining number of the components becomes equal to or lower than a predetermined warning value, CPU 60a transmits the information to host PC 13a. Host PC 13a causes loader 18 to execute the exchange work based on this instruction list. Loader 18 moves along X-axis rail 19 between storage device 13 and mounting device 15 and executes the exchange process of feeders F in work target mounting device 15.

With printing device 11, when accommodation rack 80 is accommodated in the accommodation position as shown in FIG. 7A, since accommodation rack 80 is accommodated inwards of the front surface of exchange unit 40, traveling path 14 on which automatic conveyance vehicle 16 travels can be widened. In addition, with printing device 11, since accommodation rack 80 is moved to the exchange position only for a temporary period of time during which screen masks M are exchanged as shown in FIG. 7B, a period of time during which the region of traveling path 14 is limited can be shortened.

Here, a correspondence relationship between the elements of the present embodiment and elements of the present disclosure will be clarified. Printing section 22 of the present embodiment corresponds to a printing section, exchange unit 40 corresponds to an exchange unit, mounting device 15 corresponds to a mounting device, loader 18 corresponds to a moving work device, automatic conveyance vehicle 16 corresponds to an automatic conveyance vehicle, and traveling path 14 corresponds to a traveling path. In addition, receiving section 42 corresponds to a receiving section, rack moving section 43 corresponds to a rack moving section, left-hand side unit 41 corresponds to a left-hand side unit, right-hand side unit 51 corresponds to a right-hand side unit, lifting and lowering space 49 corresponds to a lifting and lowering space, and storage device 13 corresponds to a storage device.

Mounting system 10 of the present embodiment described heretofore includes printing device 11 including printing section 22 configured to execute the printing process of printing the viscous fluid on board S, which is the processing target object, using screen mask M, exchange unit 40 disposed in printing device 11 and configured to automatically exchange printing related members for use in printing device 11 between printing device 11 and exchange unit 40, one or more mounting devices 15 including mounting section 64 configured to mount component P on board S, which is the processing target object, and loader 18 as the moving work device configured to move around the circumference of mounting device 15 so as to automatically attach and detach mounting related members for use in mounting device 15 between mounting device 15 and loader 18. In this mounting system 10, printing device 11 and mounting device 15 are disposed such that the front surfaces thereof lie on the same side, and exchange unit 40 and the moving work device are disposed on the same side. With this mounting system 10, since exchange unit 40 of printing device 11 and loader 18 of mounting device 15 are disposed on the same side, the work efficiency in exchanging members and the space efficiency of the work space can be enhanced more. In addition, with mounting system 10, since the front surfaces of printing device 11, storage device 13, and mounting device 15 lie on the same side, and loader 18 and the attachment section of storage device 13, exchange unit 40, operation door 11a of printing device 11, the operation door of mounting device 15, operation panel 38 of printing device 11, operation panel 68 of mounting device 15, and the like are disposed on the front surface side of printing device 11, storage device 13, and mounting device 15, the necessity of operator W and automatic conveyance vehicle 16 moving around to a rear surface side of the devices can be suppressed more, thereby making it possible to enhance the work efficiency of operator W and automatic conveyance vehicle 16 more.

In addition, mounting system 10 includes automatic conveyance vehicle 16 configured to convey printing related members for use in the exchange unit and convey mounting related members for use in loader 18, and automatic conveyance vehicle 16 has traveling path 14 on the side where the exchange unit and the moving work device are disposed. With this mounting system 10, since automatic conveyance vehicle 16 conveys members to be exchanged, the work load of operator W can be reduced. In addition, since automatic conveyance vehicle 16 travels on the same side as exchange unit 40 and loader 18 when automatic conveyance vehicle 16 moves to exchange unit 40 and loader 18, the moving efficiency of automatic conveyance vehicle 16, the efficiency of moving space, the exchange work efficiency, and the like can be enhanced more.

Further, exchange unit 40 includes receiving section 42 configured to receive accommodation rack 80 accommodating printing related members and rack moving section 43 configured to move accommodation rack 80 between the accommodation position where accommodation rack 80 is pulled into the interior portion of the housing of printing device 11 and the exchange position where accommodation rack 80 is made to project from the housing. With this mounting system 10, since exchange unit 40 moves accommodation rack 80 accommodating printing related members altogether, no power source is required in an interior portion of accommodation rack 80, thereby making it possible to make accommodation rack 80 compact in size. In addition, for example, when no exchange is carried out in accommodation rack 80, exchange unit 40 holds accommodation rack 80 in such a state that accommodation rack 80 is pulled into the interior portion of the housing of printing device 11, thereby making it possible to make the housing itself of printing device 11 more compact in size. Then, since printing device 11 can be made compact in size, the efficiency of the work space where to exchange members can also be enhanced more. In addition, exchange unit 40 is formed such that length A in the front-rear direction is shorter than length B of the accommodation rack in the front-rear direction. With this mounting system 10, the size of the device can be made more compact at all times except when exchange unit 40 makes use of accommodation rack 80, as a result of which the efficiency of the work space where to exchange members and the work efficiency then can be enhanced more.

Further, when accommodation rack 80 is situated in the accommodation position, exchange unit 40 accommodates accommodation rack 80 in the same surface as the main body front surface of exchange unit 40 or inwards of the main body front surface, whereas when accommodation rack 80 is situated in the exchange position, exchange unit 40 supports accommodation rack 80 in the position projecting from the main body front surface of exchange unit 40. With this mounting system 10, in particular, when accommodation rack 80 is situated in the accommodation position, the size of the device can be made more compact, as a result of which the efficiency of the work space where to exchange members and the work efficiency then can be enhanced more. In addition, exchange unit 40 includes left-hand side unit 41 disposed on the left-hand side of the housing of printing device 11 and right-hand side unit 51 disposed on the right-hand side of the housing, and has lifting and lowering space 49 where to lift up and lower accommodation rack 80 between left-hand side unit 41 and right-hand side unit 51. With this mounting system, in exchange unit 40, accommodation racks 80 can be exchanged by inserting accommodation rack 80 into lifting and lowering space 49 defined between left-hand side unit 41 and right-hand side unit 51, whereby printing related members are exchanged more easily. In addition, accommodation rack 80 has no power to move printing related members. With this mounting system 10, accommodation rack 80 can be made more compact in size, as a result of which the efficiency of the work space where to exchange printing related members and mounting related members can be enhanced more. Further, mounting system 10 includes storage device 13 for storing mounting related members between printing device 11 and mounting device 15, loader 18 exchanges mounting related members between storage device 13 and mounting device 15, and storage device 13 is disposed such that the exchange work position where to exchange feeders F lies on the same side as exchange unit 40 and loader 18. With this mounting system 10, since in exchanging printing related members and mounting related members, the exchange work can be executed on the same side as these devices, the work efficiency and the work space efficiency in exchanging members can be enhanced more.

Here, mounting system 10 of the present disclosure is not limited to the embodiment described above at all, and hence, needless to say, mounting system 10 can be carried out in various forms without departing from the sprit and scope of the present disclosure.

For example, in the embodiment described above, mounting system 10 includes automatic conveyance vehicle 16 so as to automatically convey printing related members and mounting related members; however, the present disclosure is not particularly limited thereto, and hence, operator W may convey printing related members and mounting related members. Also, with this mounting system 10, since exchange unit 40 and loader 18 are disposed on the same side, the work efficiency of operator W and the work space efficiency of operator W can preferably be enhanced more.

In the embodiment described above, printing device 11 includes receiving section 42 and rack moving section 43, and accommodation rack 80 is moved between the accommodation position and the exchange position; however, the present disclosure is not particularly limited thereto, and hence, accommodation rack 80 may be configured not to be moved. Also, with this mounting system 10, since exchange unit 40 and loader 18 are disposed on the same side, the work efficiency in exchanging members and the efficiency of the work space can be enhanced more. Here, the configuration in which accommodation rack 80 is accommodated in the main body side provides a better space efficiency and is preferable. In addition, in the embodiment described above, exchange unit 40 is formed such that length A thereof is shorter than length B of accommodation rack 80; however, the present disclosure is not particularly limited thereto, and hence, length A need not be shorter than length B. Also, with this mounting system 10, since exchange unit 40 and loader 18 are disposed on the same side, the work efficiency in exchanging members and the efficiency of the work space can be enhanced more. Here, smaller length A of exchange unit 40 provides better space efficiency and is preferable. In addition, in the embodiment described above, when accommodation rack 80 is situated in the accommodation position, exchange unit 40 is described as accommodating accommodation rack 80 in such a manner that the front surface of accommodation rack 80 coincides with the front surface of exchange unit 40 or lies inwards of the front surface of exchange unit 40; however, the present disclosure is not particularly limited thereto. For example, exchange unit 40 may be configured to support accommodation rack 80 in the position where the front surface of accommodation rack 80 projects from the main body front surface of exchange unit 40. Also, with this mounting system 10, since exchange unit 40 and loader 18 are disposed on the same side, the efficiency of the exchange work of members and the efficiency of the work space where to exchange members can be enhanced more. Here, the configuration in which the front surface of accommodation rack 80 does not project from the front surface of exchange unit 40 provides better work space efficiency and is preferable.

In the embodiment described above, exchange unit 40 includes left-hand side unit 41 and right-hand side unit 51, and the main bodies of exchange unit 40 are disposed both on the left-hand side and the right-hand side of the housing of printing device 11; however, the present disclosure is not particularly limited thereto, and hence, exchange unit 40 may be formed into an integrated structure as long as exchange unit 40 includes a space where to accommodate accommodation rack 80. In addition, exchange unit 40 is described as being disposed on the front surface side of printing device 11; however, the present disclosure is not particularly limited thereto, as long as exchange unit 40 is disposed on the same side as loader 18, and hence, exchange unit 40 may be disposed on a rear surface side of printing device 11. Here, exchange unit 40 and loader 18 are preferably disposed on the front surface side of printing device 11 and mounting device 15 because the space where to perform the work can be unified.

In the embodiment described above, the receiving section is described as receiving accommodation rack 80 by supporting the left and right end portions of accommodation rack 80 from the lower surface side thereof; however, the present disclosure is not particularly limited thereto, as long as the receiving section can receive accommodation rack 80 in any way, and hence, for example, the receiving section may be configured to support the whole of the lower surface of accommodation rack 80 or may be configured to receive accommodation rack 80 while supporting accommodation rack 80 from side surfaces or an upper surface thereof. In addition, in the embodiment described above, exchange unit 40 is described as receiving accommodation rack 80 by lifting accommodation rack 80 upwards; however, the present disclosure is not particularly limited thereto as long as exchange unit 40 can receive accommodation rack 80 in any way.

In the embodiment described above, exchange section 27 is formed into the rod structure having the abutting section which is disposed on printing head 23; however, the present disclosure is not particularly limited thereto, and hence, exchange section 27 may be configured as an independent mechanism which is disposed any of the other elements than printing head 23. In addition, in the embodiment described above, exchange section 27 is configured as the rod mechanism configured to be brought into engagement with frame 29; however, exchange section 27 may be configured as a conveyor mechanism on which frame 29 including a printing related member is placed for movement.

Figure 8:
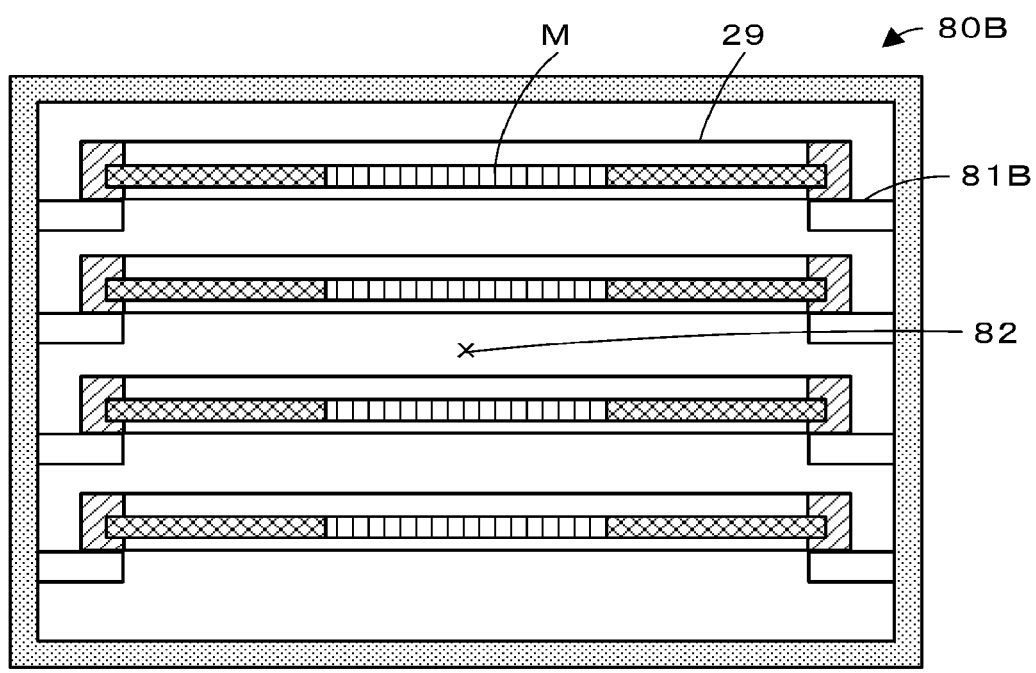
FIG. 8 is an explanatory view showing an example of another accommodation rack 80B.

In the embodiment described above, accommodation rack 80 is described as including shelf sections 81 on which frame 29 is placed; however, the present disclosure is not particularly limited thereto as long as accommodation rack 80 can accommodate multiple frames 29. FIG. 8 is an explanatory view showing an example of another type of accommodation rack 80B. This accommodation rack 80B includes shelf sections 81B provided on a left-hand side and a right-hand side in such a manner as to support corresponding end portions of frame 29 inserted thereinto. With this accommodation rack 80B, shelf sections 81 can be more simplified. In addition, in the embodiment described above, accommodation rack 80 is described as including caster sections 84; however, the present disclosure is not particularly limited thereto, and hence, caster sections 84 may be omitted, or caster sections 84 may be configured to be detachable. In addition, accommodation rack 80 is described as including handle 83; however, handle 83 may be omitted.

In the embodiment described above, accommodation rack 80 is described as having no drive section to move frame 29; however, the present disclosure is not particularly limited thereto, and hence, accommodation rack 80 may be configured to have a drive section to move frame 29. Also, with this mounting system 10, since exchange unit 40 and loader 18 are disposed on the same side, the efficiency of the exchange work of members and the efficiency of the work space where to exchange members can be enhanced more.

In the embodiment described above, printing related members exchanged by exchange unit 40 are described as being screen mask M; however, the present disclosure is not particularly limited thereto as long as printing related members are those which are required to be exchanged in printing device 11, and hence, printing related members may be any one or more of squeegee 25, support member 32 for supporting board S as the processing target object, cleaning member 34 for use in cleaning screen mask M, cartridge 36 accommodating the viscous fluid, and the like in addition to screen mask M. In addition, the viscous fluid is described as being the solder paste; however, the viscous fluid may be a conductive paste, an adhesive, or the like. In addition, in the embodiment described above, mounting related members exchanged by loader 18 are described as being feeder F; however, the present disclosure is not particularly limited thereto as long as mounting related members are those which are required to be exchanged in mounting device 15, and hence, mounting related members may be any one or more of support member 62 configured to support board S, mounting head 66, nozzle 67, and the like in addition to feeder F. In addition, the processing target object is described as being board S; however, the present disclosure is not particularly limited thereto as long as the processing target object is that on which the viscous fluid is printed or that to which the mounting process of component P is applied, and hence, the processing target object may be a three-dimensional object or the like.

INDUSTRIAL APPLICABILITY

The present disclosure is applicable to a technical field of devices for executing a component mounting process.

REFERENCE SIGNS LIST 10 mounting system, 11 printing device, 11a operation door, 12 print inspection device, 13 storage device, 13a host PC, 14 traveling path, 15 mounting device, 16 automatic conveyance vehicle, 17 management PC, 18 loader, 19 X-axis rail, 20 printing control section, 21 CPU, 22 printing section, 23 printing head, 24 print moving section, 25 squeegee, 26 mask work section, 27 exchange section, 28 mask fixing section, 29 frame, 30 board processing section, 31 board conveyance section, 32 support member, 33 cleaning section, 34 cleaning member, 35 fluid supply section, 36 cartridge, 37 detection section, 38 operation panel, 40 exchange unit, 41 left-hand side unit, 42 receiving section, 43 rack moving section, 44 lifting and lowering member, 44a cam follower, 45 lifting and lowering drive section, 47 hook portion, 48 forward-backward drive section, 49 lifting and lowering space, 50 fixing section, 51 right-hand side unit, 52 clamp lever, 53 insertion pin, 59 exchange control section, 60 mounting control section, 60a CPU, 61 board processing section, 62 support member, 63 component supply section, 63a mounting attachment section, 63b buffer attachment section, 64 mounting section, 65 head moving section, 66 mounting head, 67 nozzle, 68 operation panel, 70 movement controller, 71 CPU, 72 storage section, 73 accommodation section, 74 exchange section, 75 moving section, 78 communication section, 80, 80B accommodation rack, 80a rack main body, 81, 81B shelf section, 82 opening section, 83 handle, 84 caster section, 85 supporting and fixing member, 86 block section, 87 receiving section, 88 lock hole, 89 insertion hole, A, B length, M screen mask, S board, P component, W operator

The invention claimed is:
1. A mounting system comprising:
a printing device comprising a printing section configured to execute a printing process of printing a viscous fluid on a processing target object using a screen mask;
an exchange unit disposed in the printing device and configured to automatically exchange a printing related member for use in the printing device between the printing device and the exchange unit;
a mounting device including a mounting section configured to mount a component on the processing target object;
a storage device configured to store the mounting related members between the printing device and the mounting device;
a moving work device configured to move around a circumference of the mounting device to automatically attach and detach a mounting related member for use in the mounting device between the mounting device and the moving work device; and
an automatic conveyance vehicle configured to convey at least one of the printing related members for use in the exchange unit or the mounting related members for use in the moving work device,
wherein the printing device and the mounting device are disposed in such a manner that front surfaces thereof lie on the same side, and the exchange unit and the moving work device are disposed on the same side,
wherein the exchange unit comprises a receiving section configured to receive an accommodation rack accommodating the printing related members such that the accommodation rack is accommodated inwards of a front surface of the exchange unit, and a rack moving section configured to move the accommodation rack between an accommodation position in which the accommodation rack is received in an interior bottom portion of a housing of the printing device and an exchange position in which the accommodation rack is raised and projects from the housing,
wherein the automatic conveyance vehicle has a traveling path on a side where the exchange unit and the moving work device are disposed,
wherein the moving work device exchanges the mounting related members between the storage device and the mounting device along a rail disposed on the front surface of the mounting device and a front surface of the storage device, and wherein the storage device is disposed such that an exchange work position is disposed on the same side as the exchange unit and the moving work device.

2. The mounting system according to claim 1, wherein the exchange unit is formed such that a length in a front-rear direction is shorter than a length in the front-rear direction of the accommodation rack.

3. The mounting system according to claim 1, wherein the exchange unit accommodates the accommodation rack in the same surface as a main body front surface of the exchange unit or inwards of the main body front surface when the accommodation rack is situated in the accommodation position whereas the exchange unit supports the accommodation rack in a position projecting from the main body front surface of the exchange unit when the accommodation rack is situated in the exchange position.

4. The mounting system according to claim 1, wherein the exchange unit includes a left-hand side unit disposed on a left-hand side of the housing of the printing device and a right-hand side unit disposed on a right-hand side of the housing, and has a lifting and lowering space where to lift up and lower the accommodation rack between the left-hand side unit and the right-hand side unit.

5. The mounting system according to claim 1, wherein the accommodation rack comprises no power to move the printing related members.

6. The mounting system according to claim 1, wherein an operation door of the mounting device and an operation panel of the mounting device are provided on the front surface of the mounting device, and an operation panel of the printing device is provided on the front surface of the printing device.

* * * * *